(12) United States Patent
Ice

(10) Patent No.: US 7,646,615 B2
(45) Date of Patent: Jan. 12, 2010

(54) ELECTROMAGNETIC INFERFERENCE SHIELD FOR AN OPTOELECTRONIC MODULE

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/693,679

(22) Filed: Mar. 29, 2007

(65) Prior Publication Data

US 2008/0144303 A1 Jun. 19, 2008

Related U.S. Application Data

(60) Provisional application No. 60/870,806, filed on Dec. 19, 2006, provisional application No. 60/870,807, filed on Dec. 19, 2006.

(51) Int. Cl.
*H05K 9/00* (2006.01)

(52) U.S. Cl. .................................. 361/818; 361/728

(58) Field of Classification Search ................ 361/728, 361/816, 818
See application file for complete search history.

(56) References Cited

U.S. PATENT DOCUMENTS

| | | | |
|---|---|---|---|
| 4,215,937 A | 8/1980 | Borsuk | |
| 4,911,519 A | 3/1990 | Burton et al. | |
| 6,302,596 B1 | 10/2001 | Cohen et al. | |
| 6,494,736 B2 | 12/2002 | Mito | |
| 6,652,158 B2 | 11/2003 | Bartur et al. | |
| 6,712,527 B1 | 3/2004 | Chan et al. | |
| 6,749,448 B2 | 6/2004 | Bright et al. | |
| 6,832,856 B2* | 12/2004 | Chiu et al. | 385/53 |
| 7,300,215 B2 | 11/2007 | Hsiao et al. | |
| 2002/0136501 A1 | 9/2002 | Yen et al. | |
| 2003/0020998 A1 | 1/2003 | Kuczynski | |
| 2003/0072540 A1 | 4/2003 | Huang | |
| 2003/0147230 A1* | 8/2003 | Hultermans et al. | 361/818 |
| 2003/0185525 A1 | 10/2003 | Lacy et al. | |
| 2004/0264887 A1 | 12/2004 | Rosenberg et al. | |
| 2006/0045436 A1* | 3/2006 | Wang et al. | 385/92 |
| 2006/0093281 A1 | 5/2006 | Kesler | |
| 2006/0281357 A1* | 12/2006 | Chen et al. | 439/350 |

(Continued)

FOREIGN PATENT DOCUMENTS

JP 16012672 1/2004

(Continued)

OTHER PUBLICATIONS

U.S. Appl. No. 11/960,550, Mail Date Aug. 6, 2008, Non-Final Office Action.

(Continued)

*Primary Examiner*—Dean A Reichard
*Assistant Examiner*—Yuriy Semenenko
(74) *Attorney, Agent, or Firm*—Workman Nydegger

(57) ABSTRACT

An electromagnetic interference ("EMI") shield that can help control the emission of electromagnetic radiation from an optoelectronic module in which the EMI shield is positioned. In one example embodiment, an EMI shield includes a base and plurality of flanges extending from a perimeter of the base. The base defines an optical subassembly ("OSA") opening and a plurality of complementary structures. The OSA opening is configured to receive an OSA. Each complementary structure is configured to engage a complementary structure of an OSA connector block.

7 Claims, 9 Drawing Sheets

U.S. PATENT DOCUMENTS

2008/0298750 A1* 12/2008 Landry et al. .................. 385/88
2008/0298752 A1* 12/2008 Teo et al. ...................... 385/92

FOREIGN PATENT DOCUMENTS

| | | |
|---|---|---|
| JP | 17275407 | 10/2005 |
| JP | 18106751 | 4/2006 |
| JP | 18106752 | 4/2006 |
| JP | 18108684 | 4/2006 |
| JP | 18259731 | 9/2006 |

OTHER PUBLICATIONS

U.S. Appl. No. 11/693,674, Mail Date Sep. 10, 2008, Final Office Action.
U.S. Appl. No. 11/693,681, Mail Date Jun. 2, 2008, Office Action.
U.S. Appl. No. 11/960,530, filed Dec. 19, 2008, Donald A. Ice.
U.S. Appl. No. 11/960,550, filed Dec. 19, 2008, Donald A. Ice.
U.S. Appl. No. 11/693,687, Mail Date Jan. 24, 2008, Office Action.
U.S. Appl. No. 11/693,674, Mail Date Feb. 21, 2008, Office Action.
U.S. Appl. No. 11/693,681, Mail Date Mar. 4, 2008, Office Action.
Ice, Donald A., Optical Subassembly Connector Block for an Optoelectronic Module, U.S. Appl. No. 11/693,674, filed Mar. 29, 2007.
Ice, Donald A., Optical Connector Latch Assembly for an Optoelectronic Module, U.S. Appl. No. 11/693,681, filed Mar. 29, 2007.
Ice, Donald A., Latch Assembly for an Optoelectronic Module, U.S. Appl. No. 11/693,687, filed Mar. 29, 2007.
Ice, Donald A., Connectorized Optical Subassembly Block for Use with a Communications Module, U.S. Appl. No. 60/870,806, filed Dec. 19, 2006.
Ice, Donald A., EMI Shield for Placement between an Optical Subassembly and a Connector Block in a Communications Module, U.S. Appl. No. 60/870,807, filed Dec. 19, 2006.
U.S. Appl. No. 11/960,530, Mail Date Apr. 3, 2008, Office Action.
United States Patent and Trademark Office, U.S. Appl. No. 11/693,687, Notice of Allowance and Fees Due, mailed Sep. 26, 2008.
United States Patent and Trademark Office, U.S. Appl. No. 11/693,674, Notice of Allowance and Fees Due, mailed Feb. 6, 2009.
United States Patent and Trademark Office, U.S. Appl. No. 11/693,681, Notice of Allowance and Fees Due, mailed Feb. 10, 2009.
United States Patent and Trademark Office, U.S. Appl. No. 11/960,530, Office Action mailed Dec. 29, 2008.
Written Opinion of The International Searching Authority, and International Search Report, International Application No. PCT/US2007/088229, Mailing date: May 23, 2008.
United States Patent and Trademark Office, U.S. Appl. No. 11/960,550, Notice of Allowance and Fees Due, mailed Mar. 30, 2009.

* cited by examiner

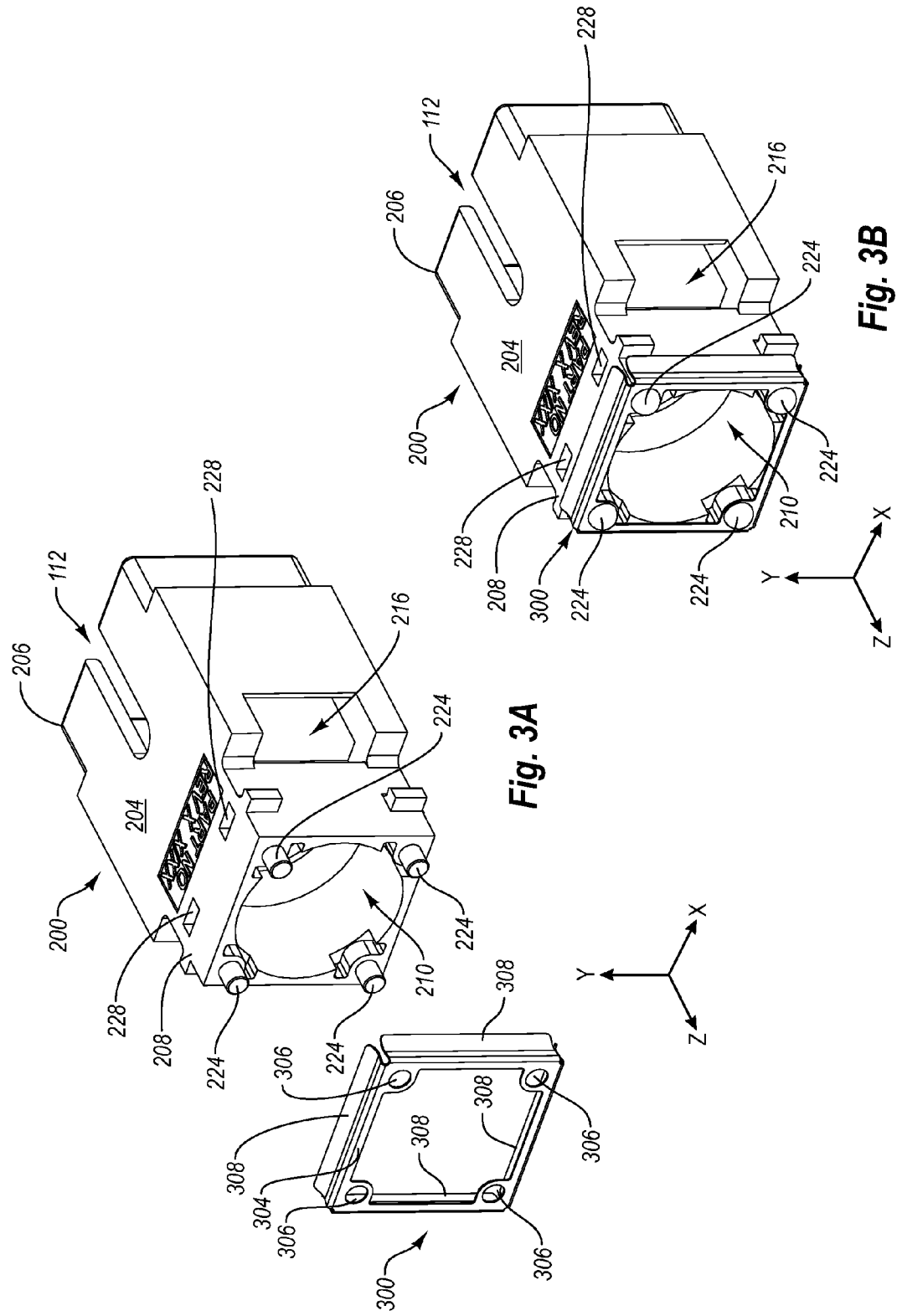

ELECTROMAGNETIC INFERFERENCE SHIELD FOR AN OPTOELECTRONIC MODULE

CROSS-REFERENCE TO RELATED APPLICATIONS

This application claims priority to U.S. Provisional Patent Application Ser. No. 60/870,806, filed on Dec. 19, 2006 and U.S. Provisional Patent Application Ser. No. 60/870,807, filed on Dec. 19, 2006, each of which is incorporated herein by reference in its entirety.

BACKGROUND

Optoelectronic modules, such as optoelectronic transceiver or transponder modules, are increasingly used in optoelectronic communication. An optoelectronic module, such as an optoelectronic transponder module, includes various components that are necessary to enable optical data transmission and reception. The components are housed within a housing of the optoelectronic module. Examples of such internal components include a printed circuit board ("PCB"), a transmitter optical subassembly ("TOSA") and a receiver optical subassembly ("ROSA"). The optoelectronic module itself is configured to be received within a host device that serves as one component of a communications network.

In order to enable optical communication with other optoelectronic modules and devices in a communications network, an optoelectronic module is configured to connect with one or more optical fibers. To enable such connection, the optoelectronic module includes both a transmit receptacle and receive receptacle that are each configured to receive an optical fiber connector. Typically, these receptacles are defined in the housing of the optoelectronic module. Though functional, this design brings with it some challenges including alignment issues between nose pieces of the TOSA/ROSA and the respective optical fiber connectors, hard plug issues, and wiggle performance concerns.

As discussed above, an optoelectronic module also often includes one or more PCBs with electronic circuitry. The electronic circuitry of a PCB can create electromagnetic interference. Electromagnetic interference ("EMI") is caused by electromagnetic radiation that can be emitted by electrical circuits carrying rapidly changing signals. Electromagnetic radiation is produced as a by-product of the normal operation of the electrical circuitry of a PCB in an optoelectronic module. The emission of electromagnetic radiation from an optoelectronic module can cause unwanted EMI to be induced in surrounding electronic devices. The emission of EMI-causing electromagnetic radiation from an optoelectronic module can thus interrupt, obstruct, or otherwise degrade or limit the effective performance of surrounding electronic devices.

SUMMARY OF SOME EXAMPLE EMBODIMENTS

In general, example embodiments of the invention relate to optoelectronic modules and, in particular, to an example electromagnetic interference ("EMI") shield for an optoelectronic module. The example EMI shield can help control the emission of electromagnetic radiation from an optoelectronic module in which the EMI shield is positioned.

In one example embodiment, an EMI shield includes a base and plurality of flanges extending from a perimeter of the base. The base defines an optical subassembly ("OSA") opening and a plurality of complementary structures. The OSA opening is configured to receive an OSA. Each complementary structure is configured to engage a complementary structure of an OSA connector block.

In another example embodiment, an OSA connector block/EMI shield assembly includes an OSA connector block and an EMI shield attached to the OSA connector block. The OSA connector block includes a monolithic body with first and second ends. The first end defines a receptacle that is configured to receive at least a portion of an optical fiber connector. The second end defines a cavity that is configured to receive at least a portion of an OSA. The EMI shield includes a base and a plurality of flanges extending from a perimeter of the base. The base defines an OSA opening that is configured to receive an OSA.

In yet another example embodiment, an optoelectronic module includes an electrically conductive housing, a transmitter OSA at least partially situated within the housing, a receiver OSA at least partially situated within the housing, and a PCB at least partially situated within the housing. The PCB is in electrical communication with the transmitter OSA and the receiver OSA. The optoelectronic module also includes a pair of OSA connector blocks at least partially situated within the housing and an EMI shield attached to each of the OSA connector blocks. Each OSA connector block corresponds to one of the OSAs and includes a monolithic body with first and second ends. The first end defines a receptacle that is configured to receive at least a portion of an optical fiber connector. The second end defines a cavity in which at least a portion of the corresponding OSA is situated. Each EMI shield includes a base and a plurality of flanges extending from a perimeter of the base. The base defines an OSA opening in which at least a portion of the corresponding OSA is situated. Each of the plurality of flanges is in electrical communication with the housing.

These and other aspects of example embodiments of the present invention will become more fully apparent from the following description and appended claims.

BRIEF DESCRIPTION OF THE DRAWINGS

To further clarify the above and other aspects of example embodiments of the present invention, a more particular description of these examples will be rendered by reference to specific embodiments thereof which are disclosed in the appended drawings. It is appreciated that these drawings depict only example embodiments of the invention and are therefore not to be considered limiting of its scope. It is also appreciated that the drawings are diagrammatic and schematic representations of example embodiments of the invention, and are not limiting of the present invention nor are they necessarily drawn to scale. Example embodiments of the invention will be disclosed and explained with additional specificity and detail through the use of the accompanying drawings in which:

FIG. 3A is an exploded rear perspective view of the OSA connector block and the EMI shield of FIGS. 2A and 2B;

FIG. 3B is a rear perspective view of the example OSA connector block and the EMI shield of FIG. 3A;

DETAILED DESCRIPTION OF EXAMPLE EMBODIMENTS

Figure 1A:
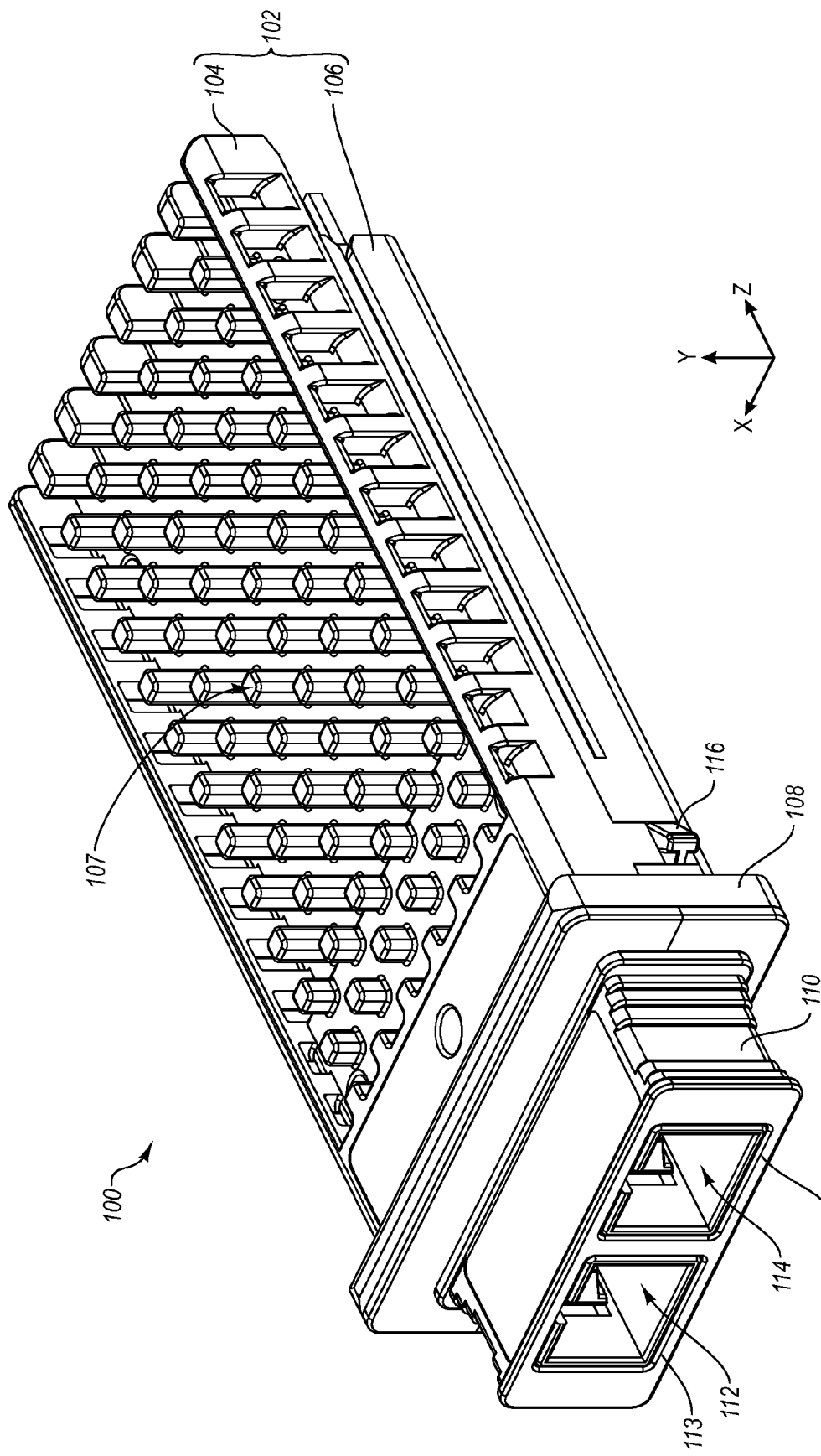
FIG. 1A discloses an example optoelectronic module.

As noted above, example embodiments of the invention relate to an example electromagnetic interference ("EMI") shield for an optoelectronic module. The example EMI shield can help control the emission of electromagnetic radiation from an optoelectronic module in which the EMI shield is positioned.

1. Example Optoelectronic Module

Reference is first made to FIGS. 1A-1D, which disclose various aspects of an example optoelectronic module 100 for use in transmitting and receiving optical signals in connection with a host device (not shown). As disclosed in FIG. 1A, the optoelectronic module 100 includes various components, including a housing 102 that includes a cover 104 and a shell 106. The cover 104 includes a heat sink 107. The heat sink 107 functions to dissipate heat generated within the optoelectronic module 100. The cover 104 and the shell 106 can be formed using a die casting process. One example material from which the cover 104 and the shell 106 can be die cast is a zinc alloy, although the cover 104 and the shell 106 may alternatively be die cast, or otherwise constructed, from other suitable materials.

Figure 1B:
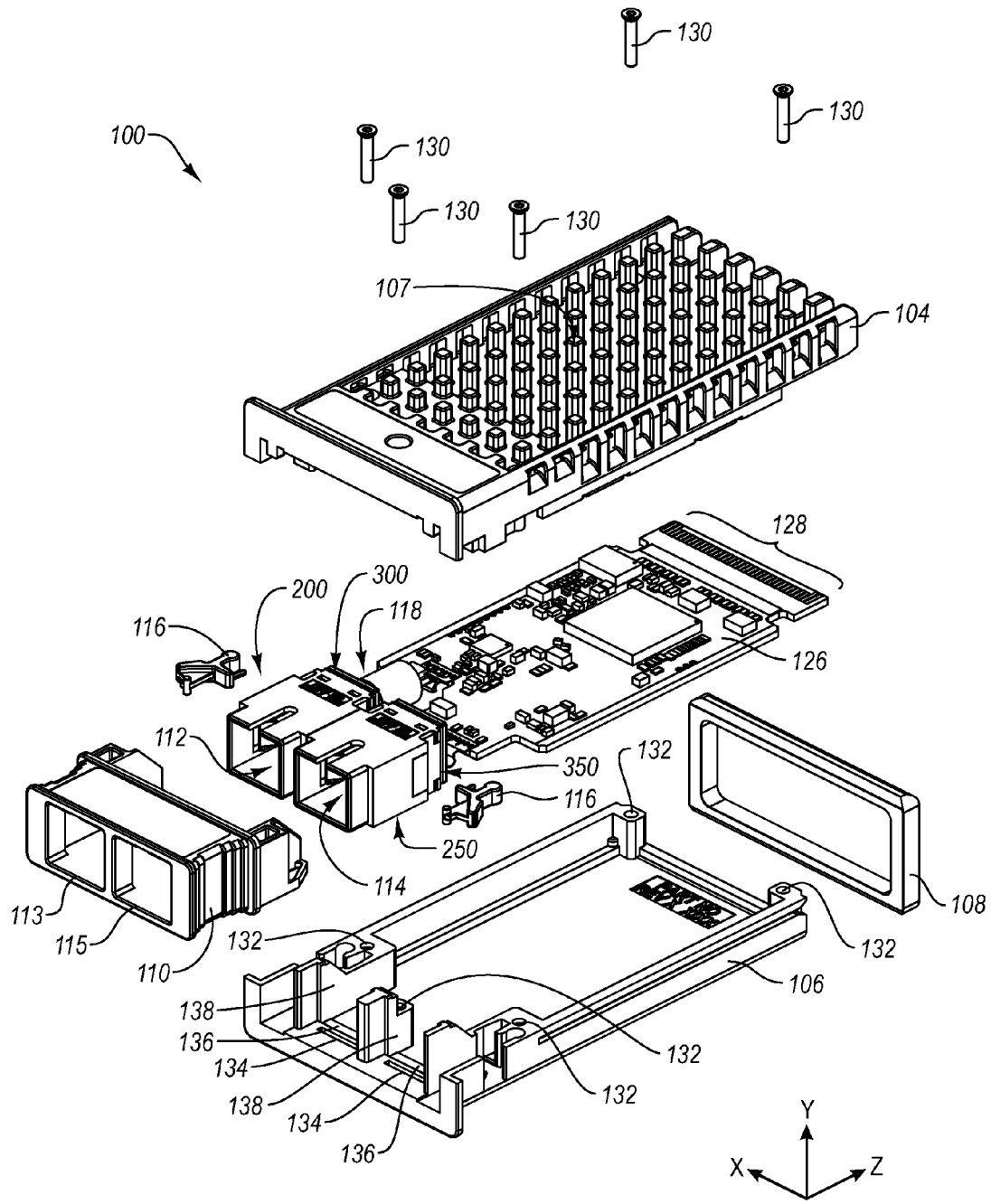
FIG. 1B is an exploded perspective view of the optoelectronic module of FIG. 1A.

As disclosed in FIGS. 1A and 1B, the example optoelectronic module 100 also includes an EMI gasket 108 that encircles the cover 104 and the shell 106, a de-latch sleeve 110 connected to the cover 104 and the shell 106, a transmit receptacle 112 and a receive receptacle 114 that can be accessed, respectively, through openings 113 and 115 defined in the de-latch sleeve 110, and a pair of latches 116 that are mechanically connected to the de-latch sleeve 110. Each of the receptacles 112 and 114 are configured to receive an optical fiber connector (not shown). The receptacles 112 and 114 can each be configured to receive an optical fiber connector having one of various configurations including, but not limited to, an SC optical fiber connector. The de-latch sleeve 110 can be employed to disengage the latches 116 from a host device (not shown). Additional details regarding the structure and function of example embodiments of a de-latch sleeve and a corresponding pair of latches can be found in co-pending U.S. patent application Ser. No. 11/693,687, titled "LATCH ASSEMBLY FOR AN OPTOELECTRONIC MODULE," which is filed concurrently herewith and incorporated herein by reference in its entirety.

Figure 1C:
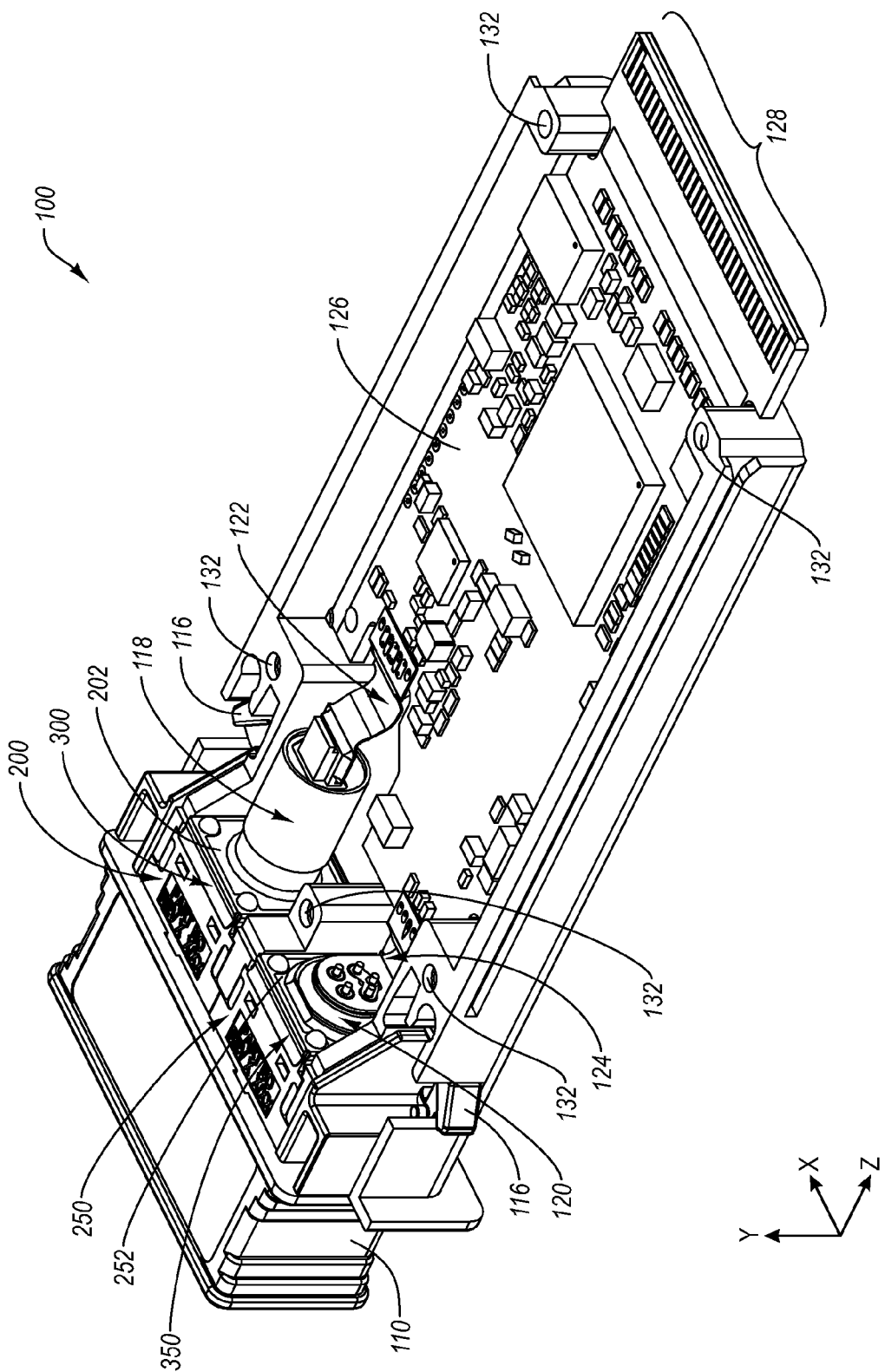
FIG. 1C is a partial rear perspective view of the optoelectronic module of FIG. 1A, with the cover removed.

As disclosed in FIGS. 1B and 1C, the example optoelectronic module 100 further includes a transmitter OSA ("TOSA") 118, a receiver OSA ("ROSA") 120, and two substantially identical OSA connector blocks 200 and 250 within which the TOSA 118 and the ROSA 120, respectively, are partially positioned. The TOSA 118 and the ROSA 120 are held in place within the OSA connector blocks 200 and 250 by adhesives 202 and 252, respectively. It is noted that as the TOSA 118 and the ROSA 120 may have different form factors, the adhesives 202 and 252 may have different sizes, shapes, and/or volumes that correspond to the different form factors, respectively, to securely and permanently connect the TOSA 118 and the ROSA 120 to the OSA connector blocks 200 and 250. The example optoelectronic module 100 also includes two substantially identical EMI shields 300 and 350 attached to the OSA connector blocks 200 and 250, respectively.

The example optoelectronic module 100 also includes electrical interfaces 122 and 124 and a printed circuit board ("PCB") 126 having an edge connector 128. The two electrical interfaces 122 and 124 are used to electrically connect the TOSA 118 and the ROSA 120, respectively, to the PCB 126. The edge connector 128 can be used to electrically connect the PCB 126 with a host device (not shown).

Figure 1D:
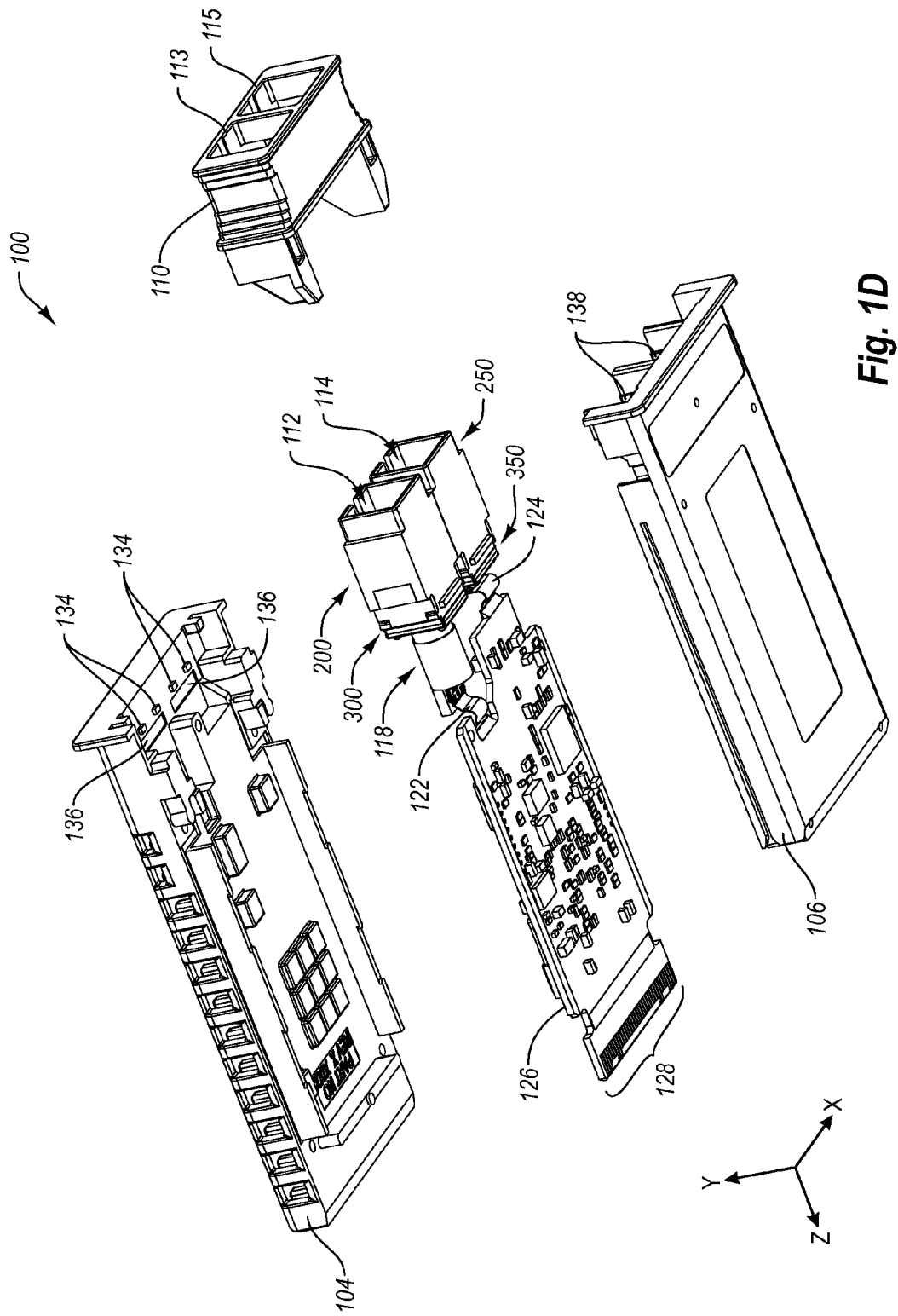
FIG. 1D is a bottom exploded perspective view of portions of the optoelectronic module of FIG. 1A.

With continuing reference to FIGS. 1B-1D, the cover 104 and the shell 106 of the housing 102 can be connected to each other using fasteners 130. The fasteners 130 are configured to pass through the cover 104 and engage holes 132 in the shell 106. As disclosed in FIGS. 1B and 1D, the cover 104 and the shell 106 of the housing 102 also includes various structures 134 that are each configured to engage complementary structures (not shown; see FIG. 2A) formed on one of the OSA connector blocks 200 or 250, as discussed in greater detail below. As disclosed in FIGS. 1B and 1D, the cover 104 and the shell 106 of the housing 102 further include indentations 136 and sidewalls 138 which are each sized and configured to engage one of the EMI shields 300 or 350, as disclosed in greater detail below. This engagement between the EMI shields 300 and 350 and the housing 102 creates a reliable electrical communication between the EMI shields 300 and 350 and the housing 102.

The optoelectronic module 100 can be configured for optical signal transmission and reception at a variety of persecond data rates including, but not limited to, 1 Gbit, 2 Gbit, 2.5 Gbit, 4 Gbit, 8 Gbit, 10 Gbit, 10.3 Gbit, 10.5 Gbit, or higher. Further, the optoelectronic module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Also, the optoelectronic module 100 can be configured to support various communication protocols including, but not limited to, Fast Ethernet, Gigabit Ethernet, 10 Gigabit Ethernet, and 1×, 2×, 4×, and 10× Fibre Channel. Further, the optoelectronic module 100 can be configured to operate at various temperature ranges including, but not limited to, 0° C. to 70° C. In addition, although one example of the optoelectronic module 100 is an optoelectronic transponder module configured to have a form factor that is substantially compliant with the X2 Multi-Source Agreement ("X2 MSA"), and is thus referred to as an X2 transponder module, the optoelectronic module 100 can alternatively be configured to have a variety of different form factors that are substantially compliant with other transceiver and/or transponder MSAs including, but not limited to, SFF, SFP, XFP, XPAK, or XENPAK.

2. Example OSA Connector Block and Example TOSA

Figure 2A:
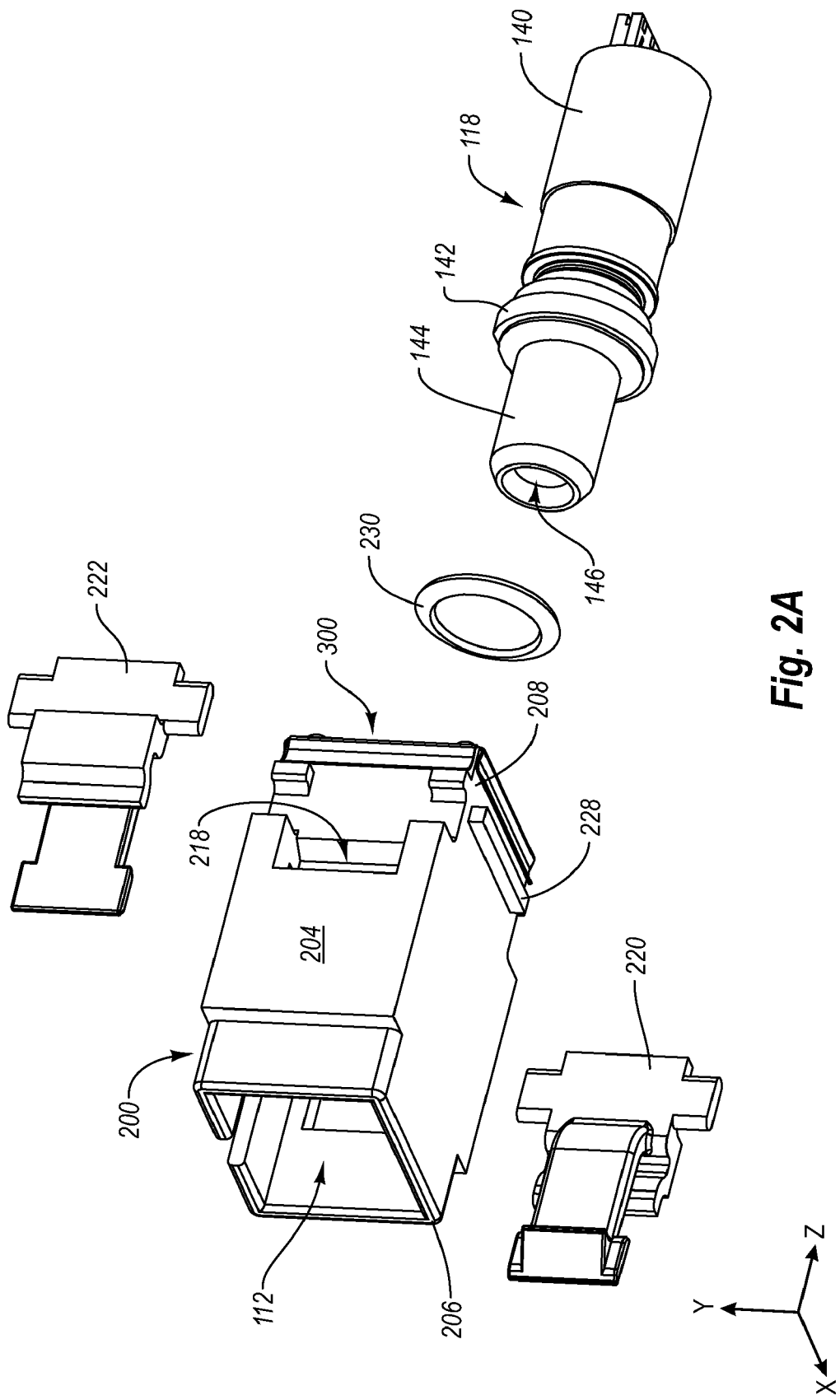
FIG. 2A is an exploded front perspective view of an example OSA connector block with an example EMI shield.
Figure 2B:
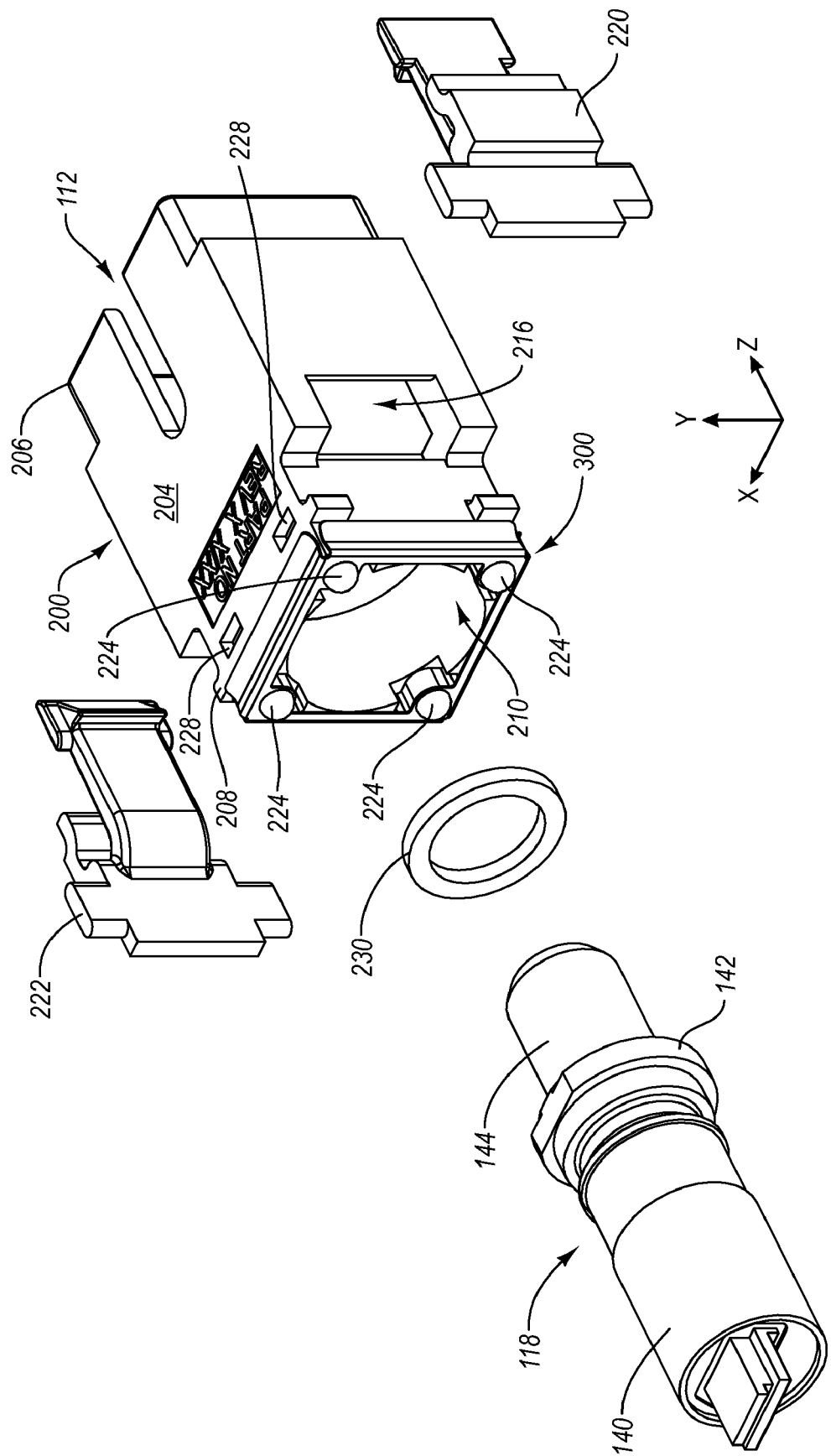
FIG. 2B is an exploded rear perspective view of the OSA connector block with the EMI shield of FIG. 2A.

With continuing reference to FIGS. 1B and 1C, and with reference now to FIGS. 2A and 2B, aspects of the example OSA connector block 200 and the example TOSA 118 are disclosed. It is noted that, since the OSA connector blocks 200 and 250 are substantially identical in this example, only the OSA connector block 200 will be described in detail here. Nevertheless, the aspects disclosed herein can be generally applied to both of the OSA connector blocks 200 and 250.

As disclosed in FIG. 1C, the TOSA 118 and the ROSA 120, respectively received in the OSA connector blocks 200 and 250, have different form factors. However, the substantially identical OSA connector blocks 200 and 250 are specifically sized and configured to accommodate OSAs having various different form factors, such as the TOSA 118 and the ROSA 120. This accommodation of different OSAs having various different form factors is accomplished by connecting the different OSAs to the substantially identical OSA connector blocks using different sizes, shapes, and/or volumes of adhesive, as discussed in greater detail below.

With continued reference to FIGS. 1B, 1C, 2A, and 2B, the TOSA 118 includes a barrel 140 within which an optical transmitter, such as a laser, (not shown) is positioned. The optical transmitter is configured to convert electrical signals received through the PCB 126 from a host device (not shown) into corresponding optical signals. The TOSA 118 also includes a flange 142 and a nose piece 144. The nose piece 144 defines a port 146. The port 146 is configured to optically connect the optical transmitter positioned within the barrel 140 with the fiber-ferrule portion of an optical fiber connector (not shown) received within the transmit receptacle 112.

Similarly, the ROSA 120 of the optoelectronic module 100, as disclosed in FIG. 1C, includes a barrel, a flange, and a nose piece (not shown) similar to the barrel 140, flange 142 and nose piece 144 of the TOSA 118. The nose piece of the ROSA 120 defines a port (not shown) similar to the port 146. The port is configured to optically connect an optical receiver, such as a photodiode (not shown), positioned within the barrel to a fiber-ferrule portion of an optical fiber connector (not shown) received within the receive receptacle 114. The optical receiver is configured to convert optical signals received from the fiber-ferrule portion of the optical fiber connector into corresponding electrical signals for transmission to a host device (not shown) through the PCB 126.

It is noted that although the outside form factors of the respective barrels, flanges, and/or nose pieces of the TOSA 118 and the ROSA 120 may differ, the general interface between these OSA components and the OSA connector blocks 200 and 250 is similar, and only the interface between the TOSA 118 and the OSA connector block 200 will be described in detail here. Nevertheless, the aspects disclosed herein can be generally applied to the ROSA 120 and the OSA connector block 250.

With continued reference to FIGS. 2A, and 2B, the example OSA connector block 200 includes a body 204. In one example embodiment, the body 204 of the OSA connector block 200 can be a substantially monolithic component. For example, the body 204 of the OSA connector block 200 can be a monolithic die-cast component, although processes other than die-casting may be employed to produce a monolithic OSA connector block 200. The body 204 of the OSA connector block 200 may be formed from a metal, such as a zinc alloy or other suitable material.

The body 204 of the OSA connector block 200 includes a first end 206 defining the transmit receptacle 112. The transmit receptacle 112 can be configured to releasably receive at least a portion of an optical fiber connector (not shown), such as an SC or an LC optical fiber connector. The body 204 of the OSA connector block 200 also includes a second end 208 defining a cavity 210. The cavity 210 can be configured to permanently receive at least a portion of an OSA, such as the TOSA 118.

The body 204 of the GSA connector block 200 may further define a pair of openings 216 and 218. The opening 216 is configured to receive at least a portion of an optical connector latch arm 220 and the opening 218 is configured to receive at least a portion of an optical connector latch arm 222. After assembly, at least a portion of each of the optical connector latch arms 220 and 222 may extend into the transmit receptacle 112 of the body 204 so that the optical connector latch arms 220 and 222 are configured to receive engage an optical fiber connector (not shown) that is plugged into the transmit receptacle 112. Additional details regarding the structure and function of example embodiments of the optical connector latch arms 220 and 222 can be found in co-pending U.S. patent application Ser. No. 11/693,681, titled "OPTICAL CONNECTOR LATCH ASSEMBLY FOR AN OPTOELECTRONIC MODULE," which is filed concurrently herewith and incorporated herein by reference in its entirety.

3. Example EMI Shield

With continuing reference to FIGS. 2A and 2B, and with reference also to FIGS. 3A and 3B, aspects of the example EMI shield 300 are disclosed. It is noted that, since the EMI shields 300 and 350 are also substantially identical in this example, only the EMI shield 300 will be described in detail here. Nevertheless, the aspects disclosed herein can be generally applied to both of the EMI shields 300 and 350.

As disclosed in FIG. 3A, the example EMI shield 300 can be a substantially monolithic component. For example, the EMI shield 300 can be formed from a single piece of conductive material, such as sheet metal, that is stamped and then bent into the configuration disclosed in FIG. 3A. The sheet metal in this example can be, but is not limited to, stainless steel sheet metal.

As disclosed in FIG. 3A, the example EMI shield 300 includes a base 302. In one example embodiment, the base 302 is a substantially planar component with a rectangular perimeter. This example configuration of the base 302 allows the base 302 to be fitted on the second end 208 of the body 204 of the OSA connector block 200. The second end 208 has a similarly sized planar face with a rectangular perimeter. In the example embodiment of the EMI shield 300 disclosed in FIG. 3A, the base 302 has a substantially square perimeter and the EMI shield 300 is substantially symmetric across both the x-z and the y-z planes. The substantially symmetric aspect of the example EMI shield 300 allows the EMI shield 300 to be fitted on the second end 208 of the body 204 of the OSA connector block 200 in any one of four different orientations. Not being limited to one or two orientations can make the assembly of the EMI shield 300 to the OSA connector block 200 less burdensome.

The base 302 of the example EMI shield 300 defines an OSA opening 304. The OSA opening 304 is configured to receive an OSA, such as the TOSA 118 or the ROSA 120. Further, although the TOSA 118 and the ROSA 120 have different form factors, as disclosed in FIG. 1C, the OSA opening 304 of the example EMI shield 300 is specifically sized and configured to accommodate multiple OSAs having various different form factors. In another example embodiment, the OSA opening 304 can be customized to receive a particular OSA having a specific form factor.

With continuing reference to FIG. 3A, the base 302 of the example EMI shield 300 and the OSA connector block 200 may also include respective complementary structures that can be configured to engage one another in order to facilitate the attachment of the EMI shield 300 to the OSA connector block 200. For example, the example EMI shield 300 may define a plurality of mounting holes 306. Each of the mounting holes 306 is configured to receive a corresponding post 224 of the OSA connector block 200. As disclosed in FIG. 3B, each of the posts 224 may be swaged after the posts 224 are received into the corresponding mounting holes 306. Swaging the posts 224 can permanently attach the EMI shield 300 to the OSA connector block 200. In one alternative embodiment, the base 302 need not define the mounting holes 306, and the body 204 of the OSA connector block 200 need not include the posts 224, and the EMI shield 300 can instead be attached to the OSA connector block in a number of different ways including, but not limited to, using a through hole, pinning, swaging, press fitting, soldering, or screw fasting.

Figure 4A:
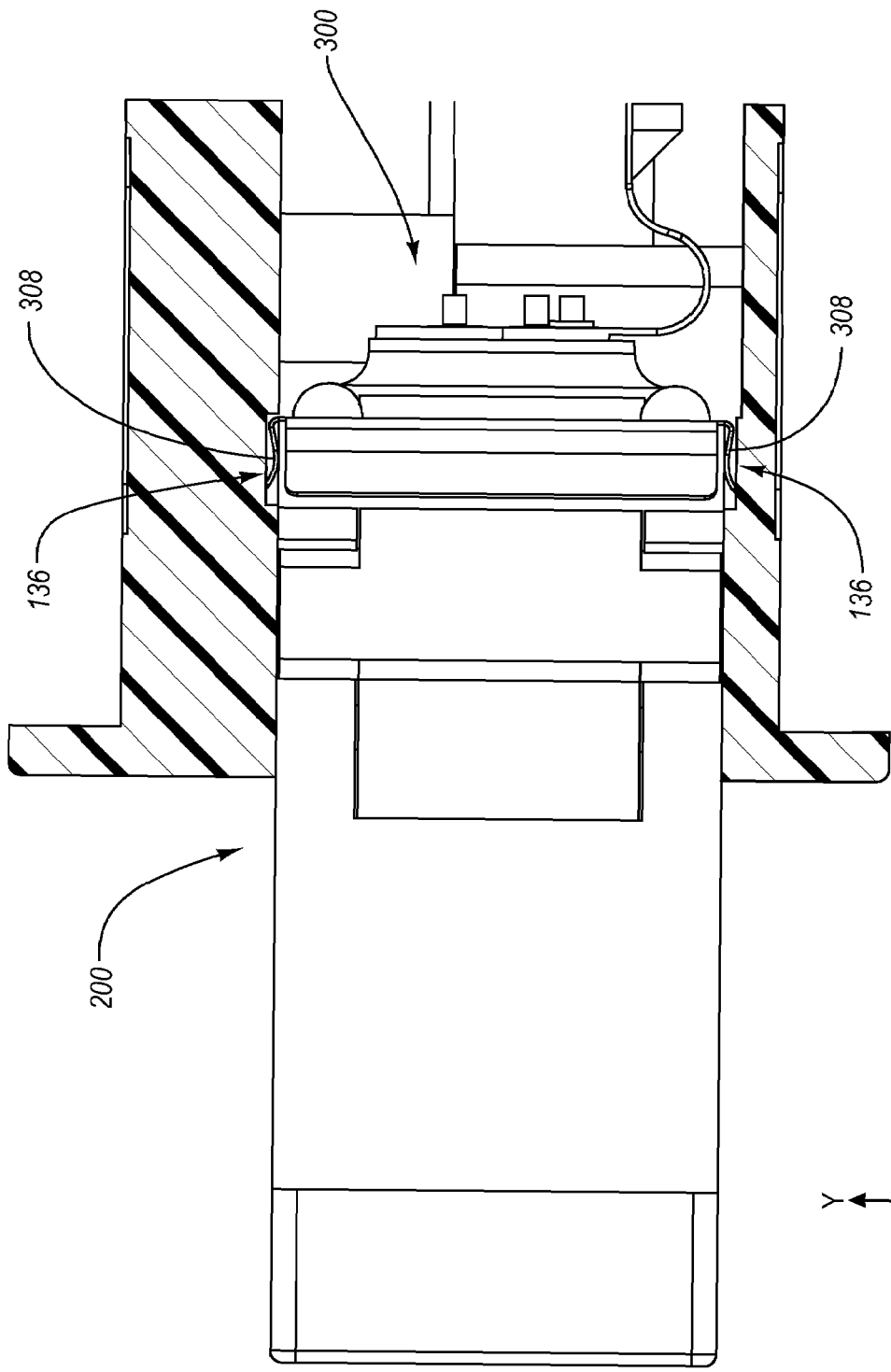
FIG. 4A is a y-z partial cross-sectional view of the OSA connector block and the EMI shield of FIGS. 2A-2B assembled into the optoelectronic module of FIG. 1A.
Figure 4B:
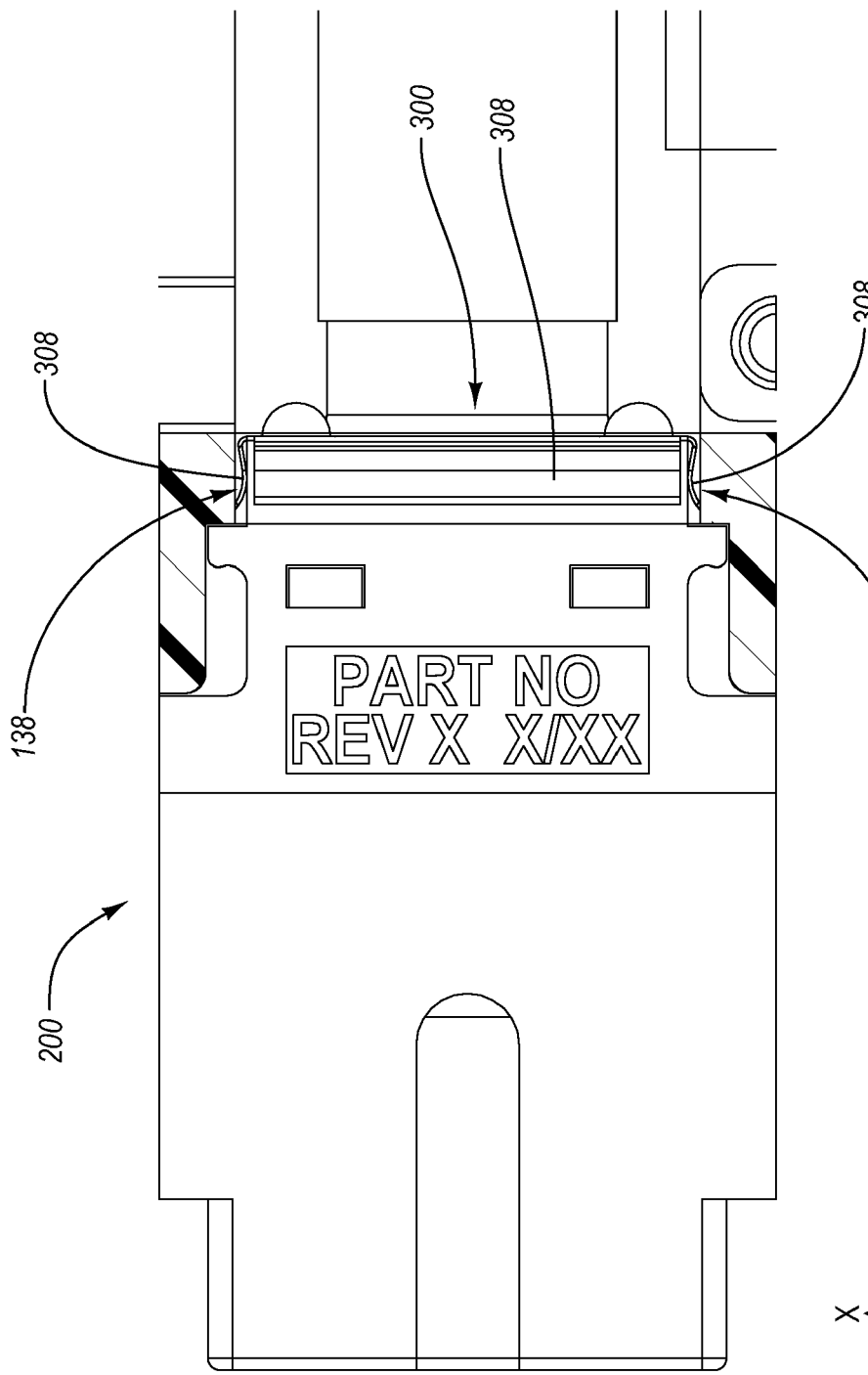
FIG. 4B is an x-z partial cross-sectional view of the OSA connector block and the EMI shield of FIGS. 2A-2B assembled into the optoelectronic module of FIG. 1A.

The example EMI shield 300 also includes a plurality of flanges 308 extending from a perimeter of the base 302. As disclosed in FIGS. 4A and 4B, a cross section of each of the flanges 308 has a curved profile. This curved profile makes each of the flanges 308 compliant and enables the flanges 308 to deflect when the EMI shield 300 is positioned within the housing 102. Each of the flanges 308 also has a cantilever configuration with respect to the base In greater detail, as disclosed in FIGS. 4A and 4b, the compliant flanges 308 are configured to bias against, and form reliable electrical communication with, the indentations 136 and the sidewalls 138 of the cover 104 and the shell 106 when the OSA connector block 200 carrying the EMI shield 300 is positioned within the cover 104 and the shell 106. In one example embodiment, the flanges 308 substantially encircle the OSA connector block 200, thus forming an electromagnetic seal around the OSA connector block 200 that helps to control electromagnetic radiation generated within the optoelectronic module 100 from emitting past the OSA connector block 200.

As disclosed in FIGS. 1B, 1D, 2A, and 2B, the body 204 of the OSA connector block 200 may further include a first set of complementary structures 228 that corresponds to a second set of complementary structures 134 defined in the cover 104 and the shell 106 of the housing 102. More specifically, the first set of complementary structures 228 and the second set of complementary structures 134 are configured to engage each other during assembly of the optoelectronic module 100 in order to appropriately position the OSA connector block 200, and the EMI shield 300, with respect to the cover 104 and the shell 106 of the housing 102. In particular, the first set of complementary structures 228 and the second set of complementary structures 134 engage each other to position the flanges 208 of the EMI shield 300 such that the flanges 208 make contact with the corresponding indentations 136 and sidewalls 138 of the cover 104 and the shell 106. It is noted that other complementary structures having different sizes, configurations, shapes, orientations, and positions could alternatively be employed, and the scope of the invention is not limited to the specific sizes, configurations, shapes, orientations, and positions disclosed in FIGS. 1B, 1D, 2A, and 2B.

Additional details regarding the structure and function of example embodiments of the OSA connector block 200 and 250 can be found in co-pending U.S. patent application Ser. No. 11/693,674, titled "OPTICAL SUBASSEMBLY CONNECTOR BLOCK FOR AN OPTOELECTRONIC MODULE," which is filed concurrently herewith and incorporated herein by reference in its entirety.

The example EMI shields 300 and 350 disclosed herein can help control the emission of EMI-causing electromagnetic radiation from the optoelectronic module 100. For example, as disclosed above, the EMI shields 300 and 350 can form a portion of an electromagnetic radiation envelope or Faraday cage that reduces or eliminates the emission of electromagnetic radiation from one or more areas of the optoelectronic module 100.

In addition, the example EMI shields 300 and 350 disclosed herein also shield the OSA connector blocks 200 and 250, respectively, from electromagnetic radiation generated from within the optoelectronic module 100, which eliminates the need for the OSA connector blocks 200 and 250 to be configured and arranged to prevent the emission of electromagnetic radiation. The example EMI shields 300 and 350 thus enable, for example, portions of the OSA connector blocks 200 and 250, and/or components integrated into the OSA connector blocks 200 and 250, to be formed from a substantially non-conductive material, or to include openings in a conductive material, without the emission of detrimental electromagnetic radiation from the optoelectronic module 100. For example, the optical connector latch arms 220 and 222 can be formed from plastic or other substantially non-conductive material, and the body 204 of the OSA connector block 200 can include the openings 216 and 218, without risking the emission of significant electromagnetic radiation through the optical connector latch arms 220 and 222 or through the openings 216 and 218.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optoelectronic module comprising:
   an electrically conductive housing;
   a transmitter OSA (optical subassembly) at least partially situated within the housing;
   a receiver OSA at least partially situated within the housing;
   a PCB at least partially situated within the housing, the PCB being in electrical communication with the transmitter OSA and the receiver OSA;
   a pair of OSA connector blocks at least partially situated within the housing, each OSA connector block corresponding to one of the OSAs, each OSA connector block comprising:
      a monolithic body including:
         a first end defining a receptacle, the receptacle being configured to receive at least a portion of an optical fiber connector; and
         a second end defining a cavity in which at least a portion of the corresponding OSA is situated; and
   a pair of EMI shields each attached to one of the OSA connector blocks, each EMI shield comprising:
      a base defining an OSA opening in which at least a portion of the corresponding OSA is situated; and
      a plurality of flanges extending from a perimeter of the base, each of the plurality of flanges being in electrical communication with the housing, each of the plurality of flanges being deflected by the housing.

2. The optoelectronic module as recited in claim 1, wherein:
   the monolithic body further includes a plurality of posts; and
   the base further defines a plurality of mounting holes in each of which a corresponding post is situated,
   wherein each of the plurality of posts is swaged so as to permanently attach the EMI shield to the monolithic body.

3. The optoelectronic module as recited in claim 1, wherein each receptacle is configured to receive an SC optical fiber connector.

4. The optoelectronic module as recited in claim 1, wherein each OSA connector block further includes a pair of substantially non-conductive optical connector latch arms, each optical connector latch arm at least partially situated within one of a pair of openings defined in the corresponding monolithic body, at least a portion of each optical connector latch arm extending into the receptacle of the corresponding monolithic body and configured to engage an optical fiber connector.

5. The optoelectronic module as recited in claim 1, wherein the housing further comprises plurality of structures configured to engage one or more of the flanges of the EMI shield.

6. The optoelectronic module as recited in claim 1, wherein each EMI shield is substantially symmetric across an x-z plane and a y-z plane.

7. The optoelectronic module as recited in claim 1, wherein the optoelectronic module substantially conforms to the X2 Multi-Source Agreement.

* * * * *